United States Patent [19]

Hansen

[11] 4,379,274

[45] Apr. 5, 1983

[54] ACOUSTIC SURFACE WAVE MULTIPLEXING FILTER

[75] Inventor: Kai Hansen, Arlington Heights, Ill.

[73] Assignee: Zenith Radio Corporation, Glenview, Ill.

[21] Appl. No.: 290,649

[22] Filed: Aug. 7, 1981

[51] Int. Cl.³ .................... H03H 9/72; H03H 9/64
[52] U.S. Cl. ................... 333/194; 310/313 D; 333/133; 333/195; 333/196
[58] Field of Search .............. 333/133, 193–196, 333/150–155; 310/313 R, 313 A, 313 B, 313 C, 313 D; 331/107 A

[56] References Cited

U.S. PATENT DOCUMENTS 3,836,876  9/1974  Marshall et al. ............... 333/195 X
4,245,200  1/1981  Takahashi et al. ............. 333/194 X
4,353,043  10/1982 Gunton ........................... 333/151

Primary Examiner—Marvin L. Nussbaum

[57] ABSTRACT

An acoustic surface wave filter is described for receiving one of two electrical signals at either of a pair of input ports and for providing a filtered electrical signal at a common output port. The filter includes a pair of input electro-acoustic transducers on a substrate, each coupled to one of the input ports, for launching surface waves in response to an electrical input signal. Each of the input transducers is associated with a multistrip coupler and an output transducer for converting the surface waves to an electrical output signal. The layout and geometry of the filter components are such that all surface waves are launched in a direction which is oblique to the substrate boundaries to reduce interference due to reflected surface waves. The layout and geometry also result in a relatively small substrate and a simultaneous reduction of insertion loss.

13 Claims, 8 Drawing Figures

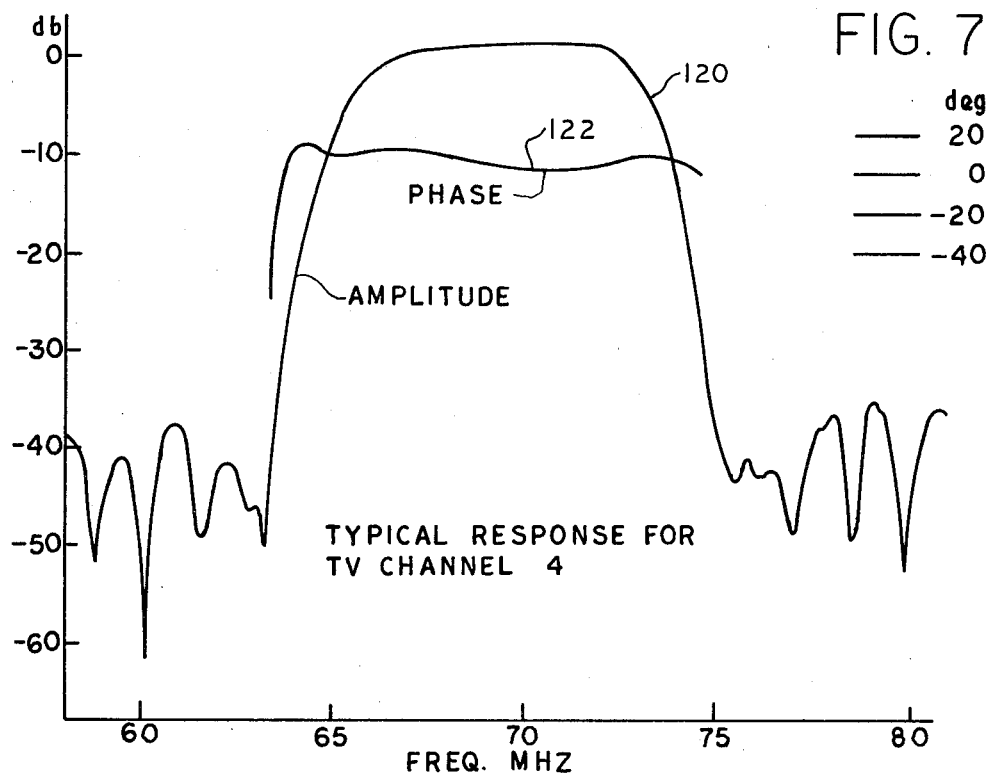
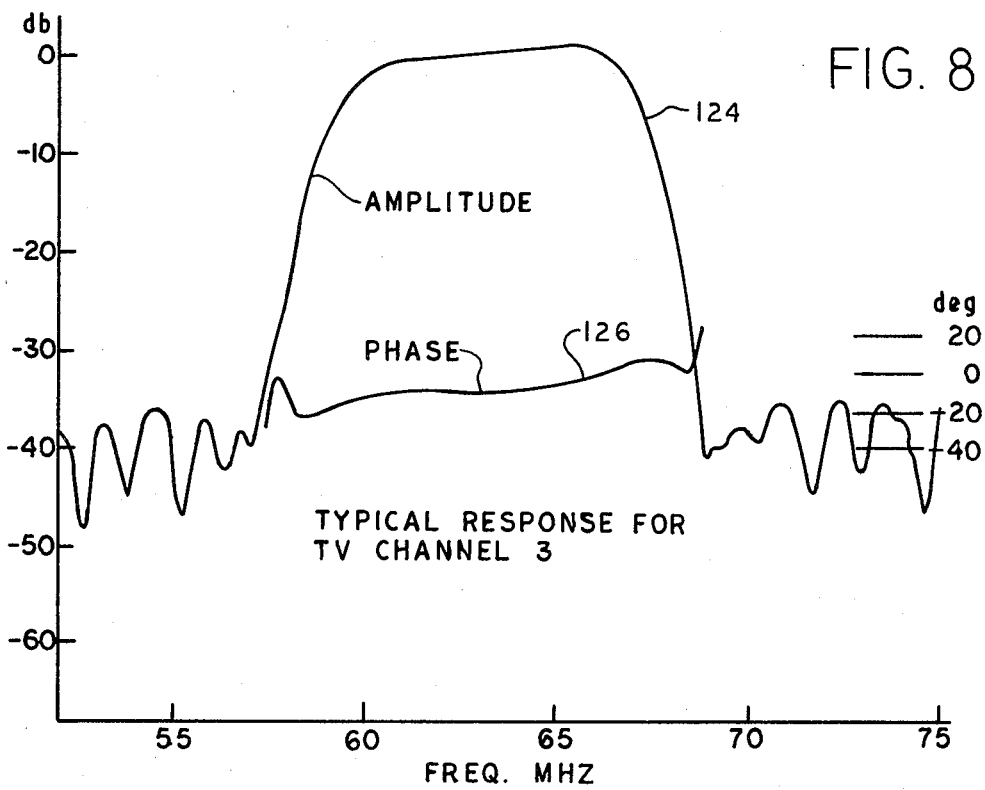

ACOUSTIC SURFACE WAVE MULTIPLEXING FILTER

BACKGROUND OF THE INVENTION

This invention is generally directed to improvements in acoustic surface wave devices. It is particularly directed to an acoustic surface wave filter for multiplexing a pair of signal inputs to develop a filtered signal output.

Multiplexing filters are typically used in applications where either one of two input signals are to be received, filtered, and output to further signal processing circuitry. For example, FIG. 1 shows a multiplexing filter 10 which is used with television games. It includes a pair of input ports for receiving either a channel 3 television signal or a channel 4 television signal, an internal channel 3 filter, an internal channel 4 filter, and an output port. Each internal filter is adapted to reject spurious signals which lie outside its passband so that, when either of the input signals are received, it arrives free of spurious signals at the output port.

The roles of the input and output ports may also be reversed. For example, the channel 3 and channel 4 signals may be applied to the output port for separation by the filter 10 so that each signal input appears at one of the designated input ports.

The advantages of constructing the filter 10 in the form of an acoustic surface wave device are well known and need not be discussed here. However, conventional acoustic filters do suffer from one or more of the practical drawbacks mentioned below.

Referring to FIG. 2, a conventional acoustic filter 12 is shown for implementing the functions of the general filter shown in FIG. 1. This filter includes an input port A coupled to an apodized channel A transducer 14, i.e., a transducer having overlapping regions of transducer fingers which are length-weighted along the transducer axis. An apodized channel B transducer 16 is coupled to input port B, and a uniform transducer 18 receives surface waves launched by the transducers 14 and 16 for generating a filtered, electrical signal at the output port. All these components are typically constructed on a substrate 20 of piezoelectric material. The frequency response of each channel in the filter 12 corresponds to the product of the frequency response of its associated apodized transducer and the frequency response of the uniform transducer 18, the latter device being used as the output transducer for both filter channels.

The problems associated with the filter 12 include undesirably high insertion losses due to the same uniform transducer 18 being common to both channels. For the same reason and because of bulk wave phenomena, the combined selectivity of the transducer 14 and transducer 18, and the combined selectivity of transducers 16 and 18, are degraded at frequencies which may overlap the two channels or occur at their boundaries. Out-of-hand spurious responses appear at approximately odd harmonics of the fundamental passband of each of the two channels.

Another conventional surface wave filter 22 is shown in FIG. 3. The substrate 24 of this filter carries a uniform transducer 26 coupled to an input port A and another uniform transducer 28 coupled to an input port B. Multistrip couplers 30 and 32 direct the acoustic energy associated with their received surface waves to an apodized channel A transducer 34 and to an apodized channel B transducer 36. The outputs of transducers 34 and 36 are coupled together as shown at an output port.

Although the filter 22 overcomes some of the problems associated with the filter shown in FIG. 2, its physical size is undesirably large and much of the substrate is unused. Its size could be reduced by modifying the geometry of the substrate if a way could be found to render harmless resultant acoustic reflections from the edges of the substrate.

These and other shortcomings of conventional acoustic surface wave devices render them less than perfectly satisfactory for use as multiplexing filters.

OBJECTS OF THE INVENTION

It is a general object of the invention to provide an improved multiplexing filter constructed of acoustic surface wave devices.

It is a more specific object of the invention to provide such a filter which provides improved insertion loss characteristics, which has a relatively small physical size with very little unused substrate area, and which does not appreciably suffer from acoustic reflections from the substrate's boundaries.

BRIEF DESCRIPTION OF THE FIGURES

The objects stated above and other objects of the invention are set forth more particularly in the following detailed description of the accompanying drawings in which:

FIG. 6 illustrates the manner in which the uniform couplers of FIG. 5 are connected in parallel; and FIGS. 7 and 8 illustrate exemplary channel A and channel B frequency and phase responses for the multiplexing filter of FIG. 5.

DESCRIPTION OF THE PREFERRED EMBODIMENT

Figure 1:
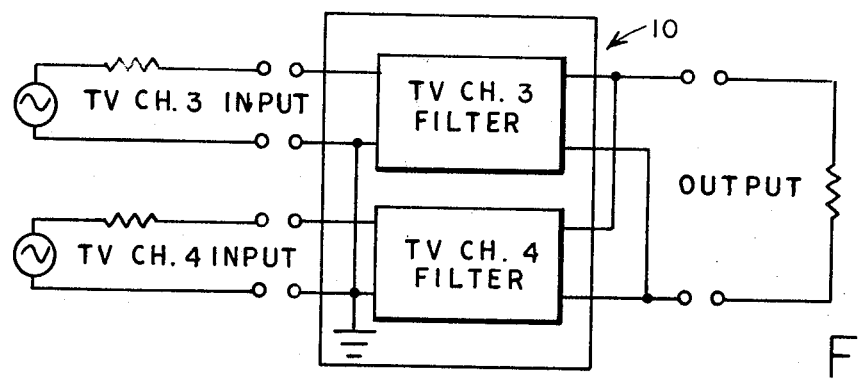
FIG. 1, previously described, is a schematic representation of the type of multiplexing filter to which the present invention is directed.
Figure 2:
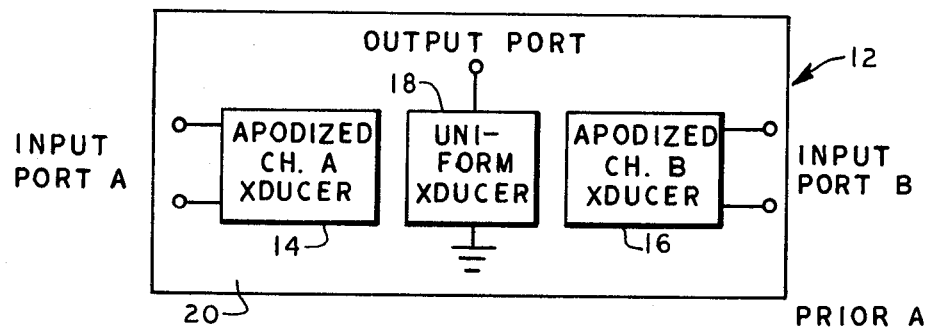
FIG. 2, referred to previously, illustrates a conventional multiplexing filter constructed of acoustic surface wave devices.
Figure 3:
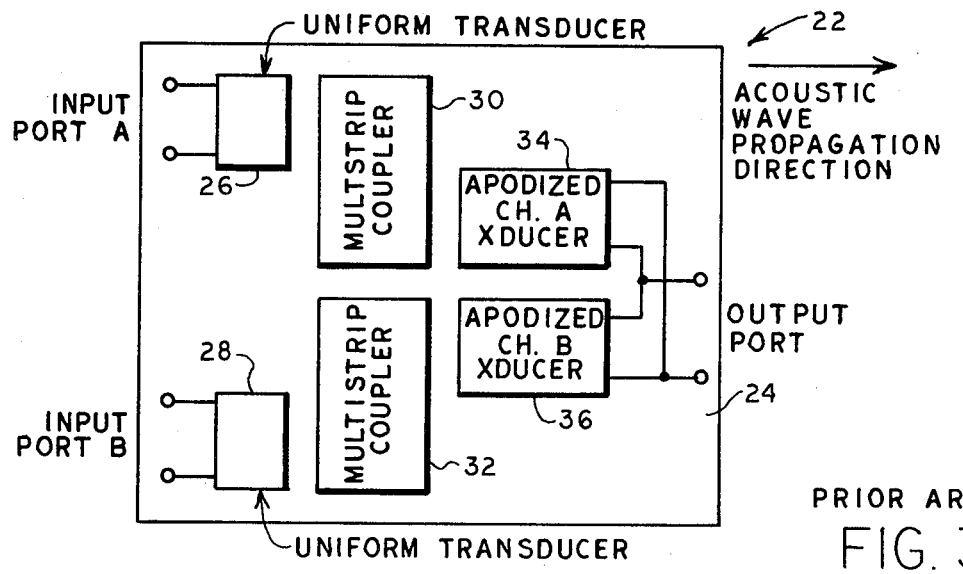
FIG. 3, also described previously, shows another conventional acoustic surface wave multiplexing filter.
Figure 4:
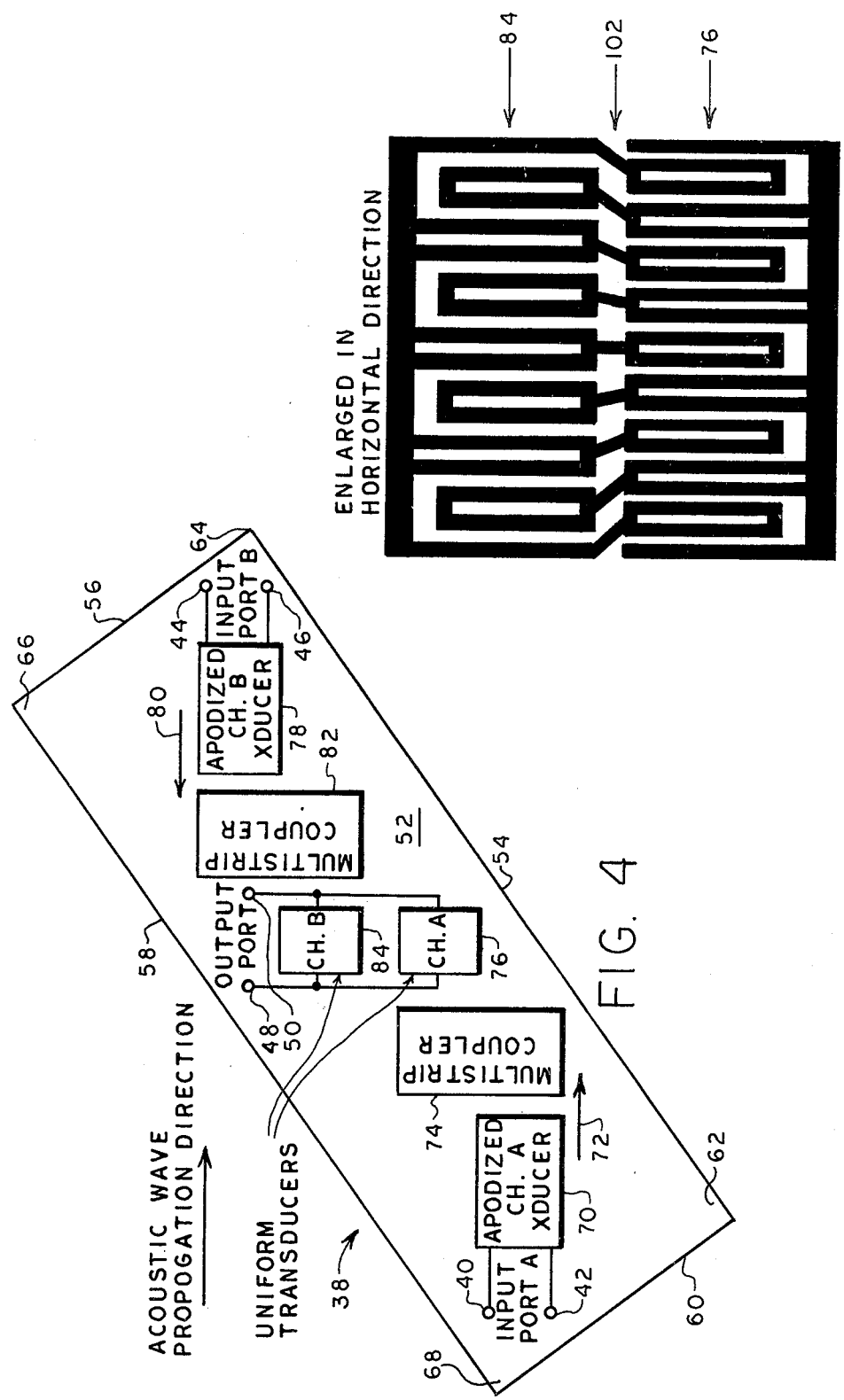
FIG. 4 illustrates an acoustic surface wave multiplexing filter according to the invention.

Referring to FIG. 4, a multiplexing filter 38 is shown whose layout and general construction are intended to overcome the deficiencies associated with the conventional filters discussed previously. Functionally, the filter 38 is similar to the filter shown in FIG. 1 in that the present filter includes an input port A for applying an RF signal to terminals 40 and 42, an input port B for applying another RF signal to terminals 44 and 46, and an output port at which a filtered RF signal is developed across terminals 48 and 50. The internal structure of the filter 38 is such that an RF signal which may include spurious frequency components may be applied to the input port A to develop a filtered RF signal (i.e., with spurious components removed) at the output port. The input port B serves the same function for an RF signal having a different center frequency.

As shown, the filter of FIG. 4 includes a substantially rectangular substrate 52 which may be made of conventional piezoelectric material. The boundaries 54, 56, 58 and 60 of the substrate define four corners 62, 64, 66 and 68. Located in the corner 68 is a first frequency sensitive electro-acoustic transducer 70 whose internal structure is conventionally designed and constructed to filter the RF signal applied to terminals 40 and 42. As shown, the transducer is designated as an apodized channel A transducer because the signal it is normally expected to receive constitutes the television signal associated with channel 3, for example. Of course, a different RF signal could be received at the input port A, in which case the transducer 70 (and other components of the filter 38) would be designed to accommodate the frequency associated with such a different signal.

Generally, the transducer 70 is positioned on the substrate so as to respond to the signal at terminals 40 and 42 for launching acoustic surface waves in the direction of the arrow 72. As indicated in the drawing, these launched surface waves travel in a direction which is oblique to the substrate boundaries and meet the boundary 54 at an angle of about 45 degrees.

Situated adjacent the transducer 70 is a first acoustic coupler 74 of the type usually referred to as a multistrip coupler. In response to the waves received from the transducer 70, the coupler 74 launches additional surface waves in a direction which is parallel to its received surface waves and which is also oblique to the substrate boundaries.

A first output transducer 76 is disposed on the substrate adjacent the coupler 74 for receiving the surface waves launched therefrom and for developing a corresponding electrical signal across terminals 48 and 50 at the output port.

To receive and filter an RF signal applied to input port B, a second apodized frequency sensitive electro-acoustic transducer 78 (channel B) is situated in the corner 64 which is diagonally opposite the corner 68. The disposition of the transducer 78 is such that it responds to the signal input by launching acoustic surface waves in the direction of the arrow 80, that is, opposite to the direction of the arrow 72 and oblique to the substrate boundaries.

Situated adjacent the transducer 78 is another multistrip acoustic coupler 82 for receiving surface waves launched by the transducer 78 and for launching additional surface waves. These additional surface waves are parallel to the direction of the arrow 82 and oblique to the boundaries of the substrate.

The waves launched by the coupler 82 are received by an adjacently located output transducer 84 which may be a uniform transducer. In response to the waves incident upon it, the transducer 84 develops a corresponding electrical signal at the output port.

It will be noted from the foregoing description that input ports A and B (and transducers 70 and 78) are located at diagonally opposite corners of the substrate, and the signal processing paths extend from those corners toward the center of the substrate. In addition, the components on the substrate are situated such that all launched surface waves travel in a direction which is oblique to the boundaries of the substrate. With this arrangement, the substrate area is economically used, interference due to wave reflections from the substrate boundaries is reduced, and insertion loss is reduced.

Figure 5:
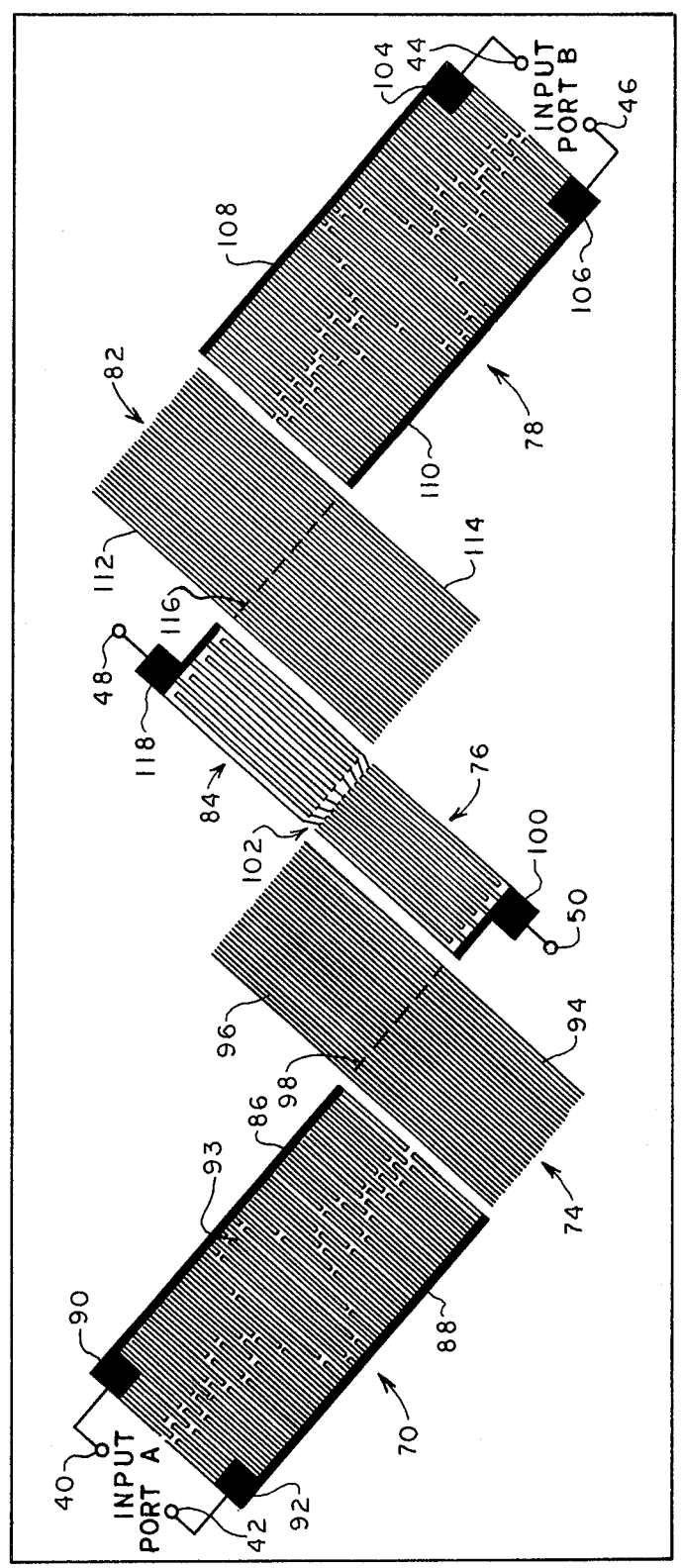
FIG. 5 shows the filter of FIG. 4 in greater detail.

The individual components of the filter 38 and their physical relationship to each other are shown in more detail in FIG. 5, to which reference is now made. Components of FIGS. 4 and 5 which serve the same function are given the same reference numerals.

In FIG. 5, the apodized transducer 70 is shown with its interdigitated fingers extending between a pair of buss bars 86 and 88. A pair of bonding pads 90 and 92 couple these buss bars to the input terminals 40 and 42.

The transducer 70 has a so-called aperture which defines the maximum distance over which adjacent fingers 93 overlap. The aperture direction is the same as the direction in which the fingers extend and its length is usually slightly smaller than the distance between buss bars 86 and 88.

Referring to the multistrip coupler 74, it includes lines which extend from a lower track 94 to an upper track 96, the division between tracks being identified by the dashed line 98. As shown, the coupler has a given height, the first half of which corresponds to the lower track 94 and the upper half of which corresponds to the track 96. The preferred alignment between the coupler 74 and the transducer 70 is such that the lines in the coupler 74 are substantially parallel to the fingers in the transducer 70 and such that the track 94 is adjacent and substantially co-extensive with the distance between the buss bars in the transducer 70.

In response to acoustic waves incident on the coupler's lower track 94, it shifts the energy associated with those waves to the upper track 96 for launching corresponding surface waves.

Referring to the uniform transducer 76, it includes fingers which run parallel to the lines in the upper track 96 for receiving acoustic surface waves launched therefrom and for converting the received waves to an electrical output between bonding pad 100 which is coupled to the output terminal 50 and bonding pad 118 which is connected to output terminal 48. As shown, the height of the transducer 76 is substantially aligned and co-extensive with the height of the multistrip coupler's second track 96.

Preferably, the uniform transducers 76 and 84 are connected acoustically in parallel and electrical in series with each other by virtue of lines 102 connecting the interdigitated fingers of each transducer with the opposing interdigitated fingers of the other transducer. The interconnections between transducer 84 and transducer 76 are shown in more detail in FIG. 6 which is enlarged in the horizontal direction.

Returning to FIG. 5, the electro-acoustic transducer 78 includes bonding pads 104 and 106 connected to the input terminals 44 and 46 and to buss bars 108 and 110.

The multistrip coupler 82 includes lines which extend from a track 112 to another track 114, the division between tracks being identified by the dashed line 116. Thus, the top half of the coupler 82 corresponds to the track 114. As with the coupler 74, the preferred alignment between the coupler 82 and the transducer 78 is such that the lines in the coupler 82 are substantially parallel to the fingers in the transducer 78 and such that the track 112 is adjacent and substantially co-extensive with the distance between the buss bars in the transducer 78.

In response to acoustic surface waves generated by the transducer 78 and incident on the coupler's track 112, it shifts the energy associated with those received waves to the track 114. The latter track then launches additional surface waves toward the uniform transducer 84. In response to receipt of these waves, the uniform transducer 84 generates a corresponding output signal between bonding pads 100 and 118.

Referring to the transducers 70 and 78, each is designed to provide a selected bandpass response to the predetermined RF signal input. The other components of the filter are likewise designed to respond to preselected frequencies. Such design procedures ae well known in the art and need not be repeated here.

In an exemplary application where the filter is design to receive RF inputs corresponding to television channels 3 and 4, the typical frequency and phase responses of the channel A and channel B components are shown in FIGS. 7 and 8. In FIG. 7, the curve 120 illustrates the frequency response of the channel A filter and the curve 122 illustrates its phase response. In FIG. 8, the curves 124 and 126 illustrate the frequency and phase responses, respectively, of the channel B filter.

In the previous discussion, ports A and B have been referred to as input ports. However, they may also serve as output ports in an exemplary application where channels 3 and 4 are both applied to the output port for separation by the channel A and B filters so that they each appear individually at one of the input ports. In other words, the roles of the input and output ports may be reversed. Hence, reference herein to input or output ports is meant to include their opposite counterparts.

Although the invention has been described in terms of a preferred filter construction, it will be obvious to those skilled in the art that many alterations and modifications may be made without departing from the invention. Accordingly, it is intended that all such alterations and modifications be considered as within the spirit and scope of the invention as defined by the appended claims.

What is claimed is:

1. An acoustic surface wave multiplexing filter for receiving an electrical signal at one of first and second input ports and for developing a filtered electrical signal at an output port, comprising:
    a substantially rectangular substrate having a plurality of boundaries;
    a first frequency sensitive electro-acoustic transducer responsive to a signal at the first input port and situated on the substrate so as to launch acoustic surface waves in a direction which is oblique to the substrate boundaries;
    a first acoustic multistrip coupler situated on the substrate adjacent the first electro-acoustic transducer so as to receive surface waves launched therefrom and to launch additional acoustic surface waves in a direction parallel to the received surface waves and oblique to the substrate boundaries;
    a first output transducer disposed on the substrate adjacent the first acoustic coupler for receiving the surface waves launched therefrom and for developing a corresponding electrical signal at the output port;
    a second frequency sensitive electro-acoustic transducer responsive to a signal at the second input port and situated on the substrate so as to launch acoustic surface waves in a direction which is oblique to the substrate boundaries;
    a second acoustic multistrip coupler situated on the substrate adjacent the second electro-acoustic transducer so as to receive surface waves launched therefrom and to launch additional acoustic surface waves in a direction parallel to its received surface waves and oblique to the substrate boundaries; and
    a second output transducer disposed on the substrate adjacent the second acoustic coupler for receiving the surface waves launched therefrom and for developing a corresponding electrical signal at the output port,
    whereby an electrical signal applied to one of the input ports is converted to a filtered signal at the output port, and acoustic waves reflected by the substrate's boundaries are rendered less easily detectable by the transducers.

2. A filter as set forth in claim 1 wherein the substrate includes four corners, wherein the first electro-acoustic transducer is situated in one corner, wherein the second electro-acoustic transducer is situated in the diagonally opposite corner, and wherein the couplers and output transducers are situated between the electro-acoustic transducers.

3. A filter as set forth in claim 2 wherein the first and second electro-acoustic transducers launch acoustic surface waves in opposite directions.

4. A filter as set forth in claim 3 wherein said first and second acoustic couplers each have a first track, a second track, and lines in the first and second tracks which run obliquely to the substrate boundaries.

5. A filter as set forth in claim 4 wherein said first and second output transducers are situated near the center of the substrate such that the first acoustic coupler is situated between the first electro-acoustic transducer and the first output transducer and the second acoustic coupler is situated between the second electro-acoustic transducer and the second output transducer.

6. A filter as set forth in claim 5 wherein the first and second output transducers are uniform transducers, wherein the first output transducer is disposed adjacent the second track of the first acoustic coupler and the second output transducer is disposed adjacent the second track of the second acoustic coupler.

7. An acoustic surface wave multiplexing filter for receiving an electric signal at one of first and second input ports and for developing a filtered electrical signal at an output port, comprising:
    a substantially rectangular substrate having a plurality of boundaries;
    a first frequency sensitive, electro-acoustic transducer responsive to a signal at the first input port and situated on the substrate so as to launch acoustic surface waves in a direction which is oblique to the substrate boundaries;
    a first multistrip coupler disposed on the substrate adjacent said first transducer, said coupler having a first track, a second track and lines in the first and second tracks which are oblique to the substrate boundaries for receiving, in the first track, acoustic waves launched by said transducer and for shifting the energy associated with its received waves to the second track for launching corresponding acoustic waves;
    a first uniform transducer disposed on the substrate adjacent said coupler, having a bonding pad coupled to the output port, and having fingers which are substantially parallel to the lines in said multistrip coupler for receiving the acoustic waves launched by the second track of the first multistrip coupler and for converting the received waves to an electric output at the bonding pad;
    a second frequency sensitive electro-acoustic transducer responsive to a signal at the second input port and situated on the substrate so as to launch acoustic surface waves in a direction which is oblique to the substrate boundaries;

a second multistrip coupler disposed on the substrate adjacent said second transducer, said second coupler having a first track, a second track, and lines in the first and second tracks which are oblique to the substrate boundaries for receiving, in its first track, acoustic waves launched by said first transducer and for shifting the energy associated with its received waves to its second track for launching corresponding surface waves;

a second uniform transducer disposed on the substrate adjacent the second multistrip coupler, having a bonding pad coupled to the output port, and having fingers which are substantially parallel to the lines in the second coupler for receiving acoustic waves launched by the second track of the second multistrip coupler and for converting the received waves to an electrical output at its bonding pad, whereby an electrical signal applied to one of the input ports is converted to a filtered signal at the output port, and acoustic waves reflected by the substrate's boundaries are rendered less easily detectable by the transducers.

8. A filter as set forth in claim 7 wherein said first and second uniform transducers are connected electrically in series and acoustically in parallel with each other by means of connecting lines.

9. A filter as set forth in claim 7 wherein said first and second electro-acoustic transducers are adapted to launch acoustic waves in mutually opposite directions.

10. A filter as set forth in claim 7 wherein said first and second electro-acoustic transducers each include buss bars across which a plurality of fingers extend to provide filtering of a received input signal, and wherein the distance between buss bars is substantially co-extensive with the first track of its adjacent multistrip coupler.

11. A filter as set forth in claim 10 wherein said first and second multistrip couplers each has a given height, a first half of which corresponds to its first track and a second half of which corresponds to its second track, and wherein the first half thereof is adjacent and substantially co-extensive with the electro-acoustic transducer from which it receives acoustic waves.

12. A filter as set forth in claim 11 wherein said first and second uniform transducers each has a given height, and wherein its height is substantially aligned with and co-extensive with the second half of its respective multistrip coupler.

13. An acoustic surface wave multiplexing filter for receiving an electrical signal at one of first and second input ports and for developing a filtered electrical signal at an output port, comprising:

a substantially rectangular, four cornered substrate;

first and second frequency sensitive electro-acoustic transducers situated on the substrate in diagonally opposite corners, the first transducer being responsive to a signal at the first input port for launching an acoustic surface wave at an angle of about forty-five degrees with respect to the immediately opposite substrate boundary, and said second transducer being responsive to a signal at the second input port for launching an acoustic surface wave in a direction opposite the direction in which the first transducer launches its waves, each of said transducers having buss bars between which a plurality of fingers extend;

a first multistrip coupler having a first track, a second track and lines in the first and second tracks which run parallel to the fingers in the first electro-acoustic transducer, the lines of the first track being adjacent and co-extensive with the fingers in the first electro-acoustic transducer for receiving waves launched by the first transducer and for shifting the energy associated with the received waves to the second track for launching corresponding acoustic waves;

a second multistrip coupler having a first track, a second track and lines in the first and second tracks which run parallel to the fingers in the second electro-acoustic transducer, the lines of its first track being adjacent and co-extensive with the fingers in the second electro-acoustic transducer for receiving acoustic waves launched by the second transducer and for shifting the energy associated with the received waves to the second track for launching corresponding acoustic waves;

first and second uniform transducers situated near the center of the substrate, connected acoustically in parallel with each other by means of connecting lines, and each connected to the output port by means of a bonding pad, the fingers of the first uniform transducer being adjacent, parallel to, and co-extensive with the lines in the second half of the first multistrip coupler for receiving acoustic waves launched therefrom and for converting the latter waves to an electrical signal at the output port, the fingers of the second uniform transducer being adjacent, parallel to, and co-extensive with the lines in the second half of the second multistrip coupler for receiving acoustic waves launched therefrom and for converting the latter waves to an electrical signal at the output port.

* * * * *